United States Patent [19]
Shaw

[11] Patent Number: 5,136,234
[45] Date of Patent: Aug. 4, 1992

[54] DIGITAL HIGH-VOLTAGE METER DEVICE

[75] Inventor: Lewis A. Shaw, Hastings, Mich.

[73] Assignee: Hastings Fiber Glass Products, Inc., Hastings, Mich.

[21] Appl. No.: 592,775

[22] Filed: Oct. 4, 1990

[51] Int. Cl.5 .......................................... G01R 31/02
[52] U.S. Cl. ..................... 324/72; 324/72.5; 324/126
[58] Field of Search ............... 324/72.5, 72, 107, 119, 324/99 D, 123 R, 126, 128, 133; 368/227

[56] References Cited

U.S. PATENT DOCUMENTS

| | | | |
|---|---|---|---|
| 3,392,334 | 7/1968 | Bevins | 324/72.5 |
| 4,298,837 | 11/1981 | Koslar | 324/72.5 |
| 4,325,024 | 4/1982 | Heidenreich et al. | 324/99 D |
| 4,904,932 | 2/1990 | Schweitzer, Jr. | 324/133 |
| 4,912,688 | 3/1990 | Syfert | 368/227 X |

*Primary Examiner*—Jack B. Harvey
*Attorney, Agent, or Firm*—Flynn, Thiel, Boutell & Tanis

[57] ABSTRACT

A digital, high-voltage meter device is comprised of two poles, each having a probe connected to high-voltage resistors. The resistors are connected to supply low-voltage inputs to a digital voltmeter. In a modification, one of the poles including its probe and high-voltage resistor, is replaced by a connector, such as an alligator clip, adapted to be releasably connected to system ground.

17 Claims, 3 Drawing Sheets

DIGITAL HIGH-VOLTAGE METER DEVICE

FIELD OF THE INVENTION

This invention relates to a digital, high-voltage meter device for providing a visible, digital indication of the approximate voltage carried by high-voltage electrical utility transmission lines, underground cables and switch gear, and for determining the phase relationship of the voltage. The digital, high-voltage meter device is mountable on electrical utility pole means, commonly referred to as hot sticks, for use by utility company linemen.

DESCRIPTION OF THE PRIOR ART

Portable, phasing tester/voltmeters suitable for determining phase relationships of the voltages carried by electrical utility power supply lines and determining the approximate line-to-line and line-to-ground voltages have been widely utilized for many years. In such meters, the readout mechanism has been in the form of an analog display. It has been difficult to provide a portable, phasing tester/voltmeter having a digital display and employing integrated circuits because of interference from the high-voltage fields that are present around high-voltage electrical utility transmission lines and switch gear.

According to the invention, there is provided a portable, digital, high-voltage meter device for identifying the phases and for determining the approximate line-to-line or line-to-ground voltage of overhead or underground electrical utility power lines and switch gear, which meter comprises a pair of elongated poles made of electrical insulating material. Each of the poles has a probe at one end thereof and each pole contains high-voltage resistor means connected to its associated probe and adapted to provide a relatively low current output signal. A casing is mounted on one of the poles. The casing contains a circuit board providing a digital voltmeter and a battery for powering the voltmeter. The digital voltmeter has a pair of input terminals, one of which is connected to the resistor means of one of the poles. A self-retracting, coiled, cable extends between the poles. The cable has a conductor therein, one end of which is connected to the resistor means in the other pole and the other end of which is connected to the other of the input terminals of the digital voltmeter. Thus, an A.C. signal is supplied to the digital voltmeter when the probes contact A.C. electrical lines. The digital voltmeter comprises filter means for filtering out selected high frequency range and low frequency range components of the A.C. signal, A.C. amplifier means for amplifying the filtered A.C. signal, rectifying means for rectifying the filtered A.C. signal and a digital meter connected for receiving the rectified signal and providing a visible, digital, readout indicative of the A.C. voltage sensed by the probes.

In a modification of the invention, one of the poles and its associated probe and resistor means is replaced by a connector, such as an alligator clip, which can be connected to a system ground of an underground power distribution circuit.

In other modifications, loadbreak bushing adapters can be used, in place of the probes, so that the device can be used for measuring the voltages in underground cables. Also, the probes can be replaced by extension resistors in order to increase the voltage range that can be measured. Further, the device can be used in conjunction with an encapsulated high-voltage rectifier for testing the integrity of the insulation of underground cables and to determine if all of the grounds have been removed after completion of working on a de-energized underground system.

DETAILED DESCRIPTION

Figure 1:
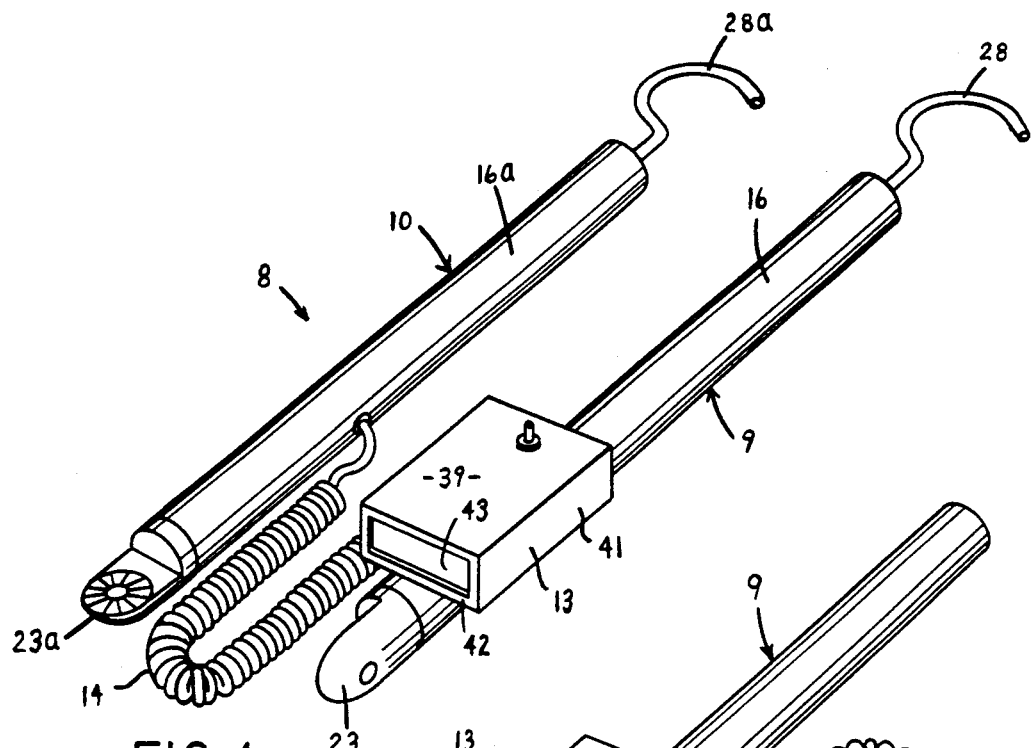
FIG. 1 is a perspective view of a digital high-voltage meter device according to the present invention.

The digital, high-voltage meter device 8, according to the present invention, is comprised of two poles 9 and 10 made of electrical insulating material, such as resin-bonded fiberglass. Each of the poles 9 and 10 is mounted on an elongated, electrically insulating hot stick 11 (FIG. 4) so that the electrical company lineman can place each pole 9 and 10 on an electrical utility line or switch gear which may be located many feet above the ground. The hot sticks 11 can be of any suitable type and form no part of the present invention. An example of a suitable hot stick is disclosed in U.S. Pat. No. 4 069 978.

A housing 13 is mounted on one of the poles, here the pole 9, and it contains the electrical circuit elements of the digital, high-voltage meter device 8. A coiled, self-retracting cable 14 extends between the poles 9 and 10 for purposes to be described below.

Figure 2:
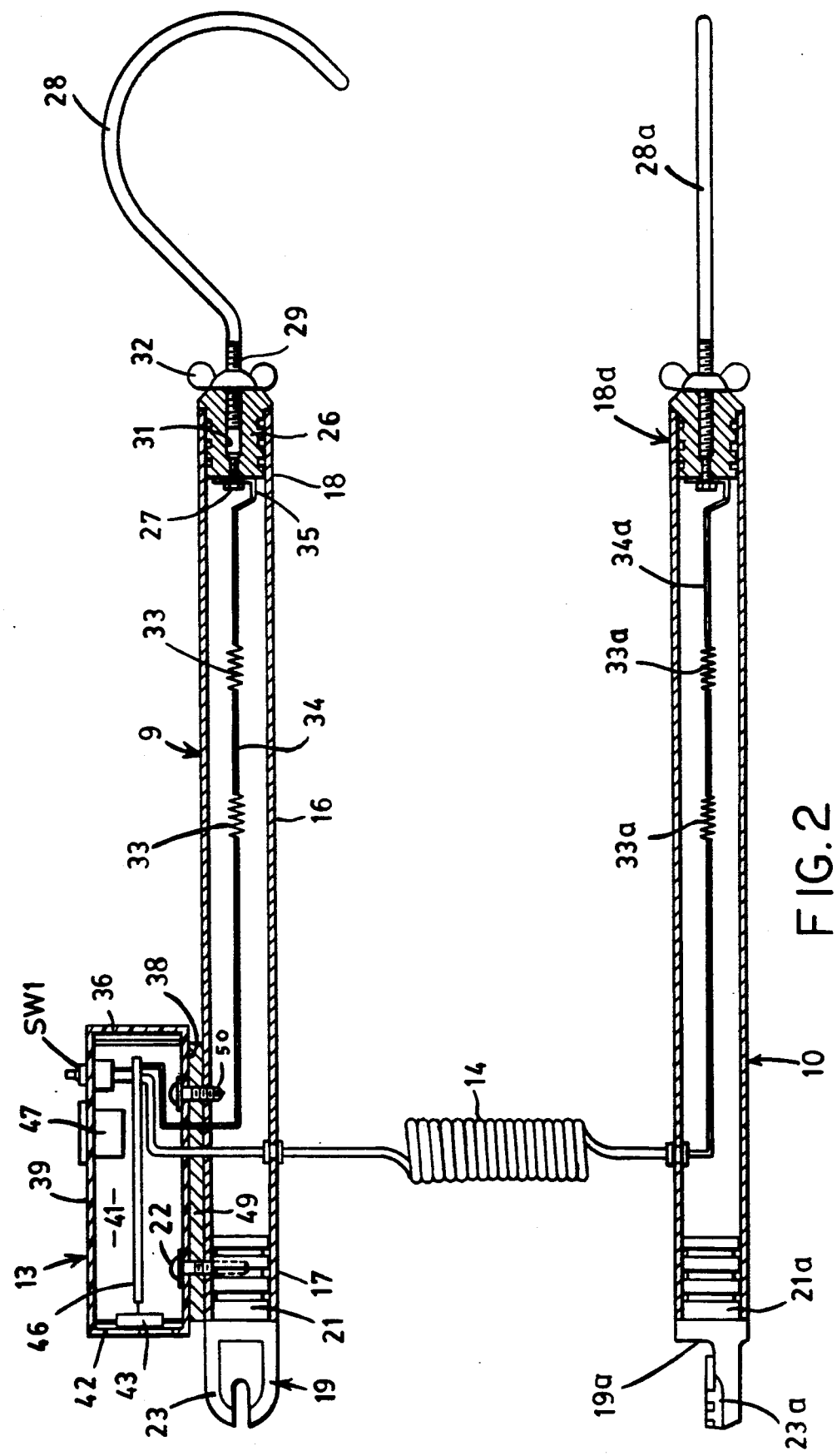
FIG. 2 is a central sectional view through the high-voltage meter device according to the present invention.

Referring to FIG. 2, the pole 9 comprises a tube 16 having an inner end 17 and outer end 18. An electrically conductive, universal mounting fitting 19 is provided on the inner end 17 of the tube 16. The fitting 19 comprises a post 21 which is slidably received in the inner end 17 of the tube 16 and is secured therein by an epoxy adhesive. A screw 22 is provided to secure the housing 13 to the tube 16 and to provide electrical contact between the circuit parts inside the housing and the fitting 19. The fitting 19 has an adapter section 23 which is adapted to be coupled to a universal head 24 (FIG. 4) mounted on the end of the hot stick 11 in a conventional manner so that the tube 16 can be disposed at a selectable angle relative to the longitudinal axis of the hot stick 11 and can be releasably clamped in such adjusted position.

An electrically conductive end fitting 26 is slidably received in the outer end 18 of the tube 16 and is releasably secured therein by an epoxy adhesive. A probe 28 has a shank 29 which is threaded into a central opening 31 in the end fitting 26 and is releasably secured therein by a wing nut 32. The probe 28 is here illustrated as being a hook-shaped probe which can be hung on the power line to be tested. It will be understood, however, that the probe 28 can be of any desired shape, such as a straight rod, or other suitable adapter acceptable for overhead or underground systems, as the need dictates.

A pair of encapsulated resistors 33 are disposed inside the tube 16 and are connected by a conductor 34. A soldering lug 35 is provided on the outer end of the conductor 34 and said soldering lug is attached to the end fitting 26 by a bolt 27.

The pole 10 is constructed in a similar manner to pole 9 and, therefore, a detailed description of it is believed to be unnecessary. In the drawings, corresponding parts of the pole 10 are identified by the same reference numerals with the suffix "a" added.

The housing 13 is of generally rectangular, box-like configuration and is comprised of an outer end wall 36, a base wall 38, a top wall 39 and a pair of sidewalls 41. The inner end wall of the housing 13 is defined by an end panel 42 on which there is mounted a digital readout device 43. In the illustrated embodiment, the digital readout device 43 is a window-mounted, digital meter, such as a Modutec model BL 300102-01 DPM, with a five-volt backlight and a nine-volt D.C. meter supply. The window-mounted, digital meter 43 is commercially available from Modutec Incorporated of Norwalk, Conn. The invention is not limited, however, to the specific digital meter mentioned above.

The housing 13 is made of electrical insulating, moldable, synthetic resin. An electrically conductive shield coating is applied to the inner surface of the housing 13 in order to prevent the digital meter from being exposed to high electrical field gradients. The electrically conductive shield coating on the housing is electrically connected to the printed circuit board 46. Although the charging current flowing in the shield coating will cause a small error in the signal being measured, this error will not be significant because the digital, high-voltage meter device 8 has a minimum resolution of 100 volts.

A printed circuit board 46 is mounted inside the housing 13. A battery is removably mounted in a battery holder 47 for powering the electrical components of the digital, high-voltage meter device. A power switch SW1 is provided for starting operation of the unit 8.

A spacer 49 is provided between the base wall 38 of the housing and the tube 16. A screw 50 is provided for securing the housing 13 to the tube 16.

Figure 3:
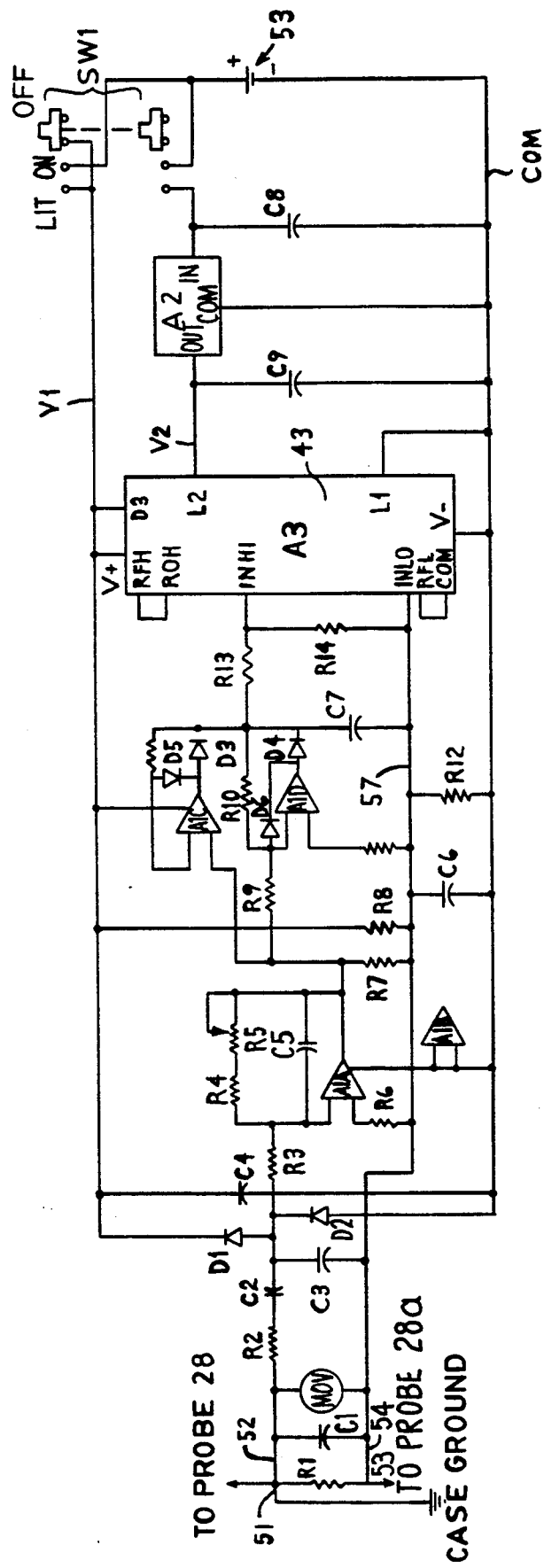
FIG. 3 is a circuit diagram of the digital, high-voltage meter device.

Referring to FIG. 3, the circuit for the meter 43 is powered by the battery 53 in battery holder 57, such as a conventional nine-volt battery. The power switch SW1 is a two-pole, three-position toggle switch. The three positions of the switch SW1 are "OFF", "ON" and "LIT". The "LIT" position signifies that the circuit is "on" and that the backlight of the meter element is lit. The "ON" position signifies that the circuit is "on" and that the backlight of the meter element is not lit. The "OFF" position signifies that the circuit is "off" and that the backlight of the meter element is not lit. When the power switch SW1 is in "ON" position, the battery plus terminal is connected to conductor V1. When the power switch SW1 is in the "LIT" position, the battery plus terminal is connected to conductor V1 and to the voltage regulator chip A2. The voltage regulator chip A2 provides a suitable voltage on conductor V2, such as about five volts, for operating the backlight of the meter 43. Thus, in a typical embodiment of the invention, the conductor V1 will carry nine volts when the power switch SW1 is in either the "ON" position or the "LIT" position, and conductor V2 will carry about five volts when the power switch SW1 is in the "LIT" position.

The probe 28 is connected to a terminal 51 of a conductor 52 and the probe 28a is connected to a terminal 53 of a conductor 54 in order to provide input A.C. signals to the electrical circuit of the unit 8. An input load resistor R1 and an input capacitor C1 are connected between the conductors 52 and 54 whereby to provide a voltage drop of a selected value across their connection. For example, resistor R1 and capacitor C1 may provide a voltage drop of slightly less than 2.000 volts RMS across their connection when one milliamp A.C. is applied through them. The conductor 34 and the cable 14 are connected to the circuit board 46 to supply thereto two separate inputs at 51 and 53 which are indicative of the voltages on the probes 28 and 28a.

A voltage spike suppressor MOV can be provided across the conductors 52 and 54 to provide the capability of withstanding large surges of voltage. The voltage spike compressor MOV can be omitted if it is likely that the instrument may be subjected to large surges, such as caused by an arc-over, that will destroy the instrument anyway.

Resistor R2 and capacitor C3 provide a first filter against the passage of high frequency signals. It may be desired to cut off signals above about 300 Hz which is the sixth harmonic of the power line. Further, diodes D1 and D2 clamp the input voltage and R2 provides a blocking action. The voltage is clamped at the position of resistor R2 and capacitor C3 so that a clamped signal is supplied to the terminals of the first stage amplifier A1A. This prevents any input signals from exceeding the supply voltage range of the first stage amplifier A1A.

Capacitor C2 serves as a D.C. blocking capacitor. If capacitor C2 were not provided, it is possible that some amount of D.C. current, sufficient to make the meter reading inaccurate, would take place because of anomalies in the resistances of the conductors, such as oxide films on the wires, so that some rectification might take place. Also, capacitor C2 in combination with the net input resistance of the first-stage amplifier A1A provides a low pass cutoff of 12 Hz to eliminate signals of 12 Hz or less, that might otherwise be passed and measured.

The amplifier sections A1A, A1B, A1C and A1D are provided by an integrated circuit chip, commonly known as a quad operational amplifier. One typical and acceptable example of a quad operational amplifier is Motorola Part No. 3303P Quad OP-AMP Chip. The amplifier section A1B is tied off and is non-functional. The amplifier section A1A, in combination with resistance R4 and variable resistance R5, the net input resistance of resistances R2 and R3 and the capacitor C5 provides an additional filter against high frequency signals, such as 300 HZ or higher, and isolates the input resistor R1 from the metering circuits to be described below. In the illustrated example, when the voltage drop across R1, C1 is 2 V RMS, the output of amplifier A1A is approximately 1 V RMS. A gain adjustment of, for example, plus or minus 15%, can be achieved by adjustment of the variable resistance R5.

Amplifier section A1C rectifies the positive half of the A.C. signal at the output terminal of amplifier section A1A. When the input voltage to amplifier section A1C is higher than the stored D.C. output voltage in output filter capacitor C7, it provides charging current to the output filter capacitor C7 via diode D3. Diode D5 is a feedback component for increasing the speed and accuracy of the amplifier.

Amplifier section A1D rectifies the negative half of the A.C. signal at the output terminal of amplifier section A1A. This is done by the inverting action of amplifier section A1D in combination with the resistances R9 and R10. When the output voltage to amplifier A1D exceeds the voltage stored in capacitor C7, it provides charging current to the output capacitor C7, via diode D4. Diode D6 is a feedback component for increasing the speed and accuracy of the amplifier.

Capacitor C7 filters any pulses generated by the two amplifier sections A1C and A1D so that the resulting A.C. voltage on the capacitor C7 is less than 4% of the D.C. voltage output.

The resistances R8 and R12 divide the battery voltage applied to conductors V1 and COM so that a reference voltage is present on conductor 57, which reference voltage acts as a synthetic ground for amplification, filtering and rectification. Capacitor C6 has a low impedance at 60 Hz compared to the resistors and provides a low impedance path for A.C. currents that exist in the circuit.

A net D.C. signal, for example, approximately 1.414 V D.C., is produced across capacitor C7. The resistances R13 and R14 divide the voltage on capacitor C7 to provide an input signal to the meter element A3. The Modutec BL 300102-01 meter element, identified as A3, is specified as one having a range of 0 to 1.999 V VC input, operating from a supply of 9 V D.C. and having a backlight using 5 V D.C. The signal from capacitor C7 is supplied to the "INHI" terminal of the meter element A3. The terminal D3 of the meter element is a decimal point selector and it is chosen to provide a display in kilovolts (kV) to one decimal place whereby to provide a resolution of 100 V. The necessary backlight voltage is supplied to terminal L2 of the meter element A3 from the voltage regulator A2. Because the backlight draws a considerable amount of current, in order to avoid excessively rapid draining of the battery 53, it will be possible for the user to elect to use the meter only. The Modutec meter element A3 has the capability of sensing low battery voltage and displaying this by means of a visible message so that the user can take appropriate steps to replace the battery when needed.

In use, the user will switch on the electrical circuit by means of the switch SW1, extend the two probes 28 and 28a and attach them to separate high tension wires. The user can then observe the voltage between the two wires on the digital meter 43.

The circuit includes filtering means, including resistance R2 and capacitor C3, against high frequency voltage so that arcing and sparking which may occur when the probes are attached to the high-voltage lines, will not cause damage to the meter circuit. Also, the meter circuit is protected against high-voltage surges.

Various accessories can be attached to the unit in order to provide additional functions. For example, extension resistors can be attached to the outer ends 18 and 18a of the poles 9 and 10, in place of the probes 28 and 28a, so that the voltage range of the unit can be increased to, for example, from 0 to 80 kV.

Figure 4:
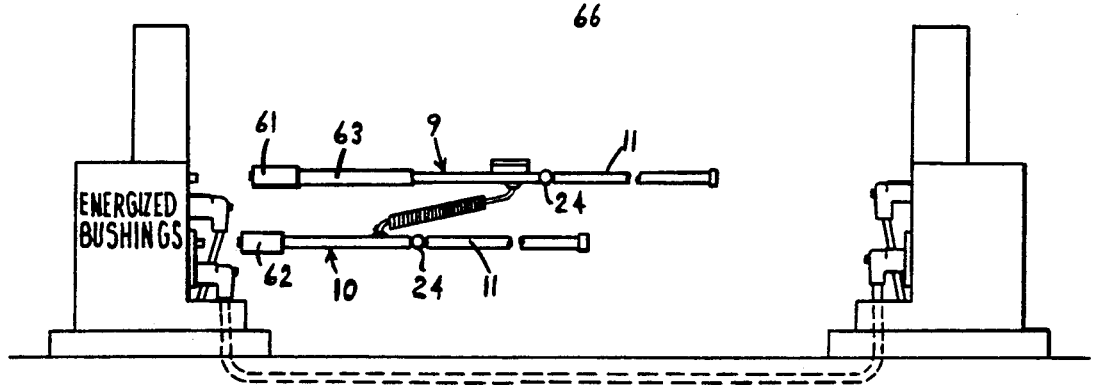
FIG. 4 is a schematic view of the digital, high-voltage meter device shown in association with hot sticks and adapters for testing an underground cable.

Referring to FIG. 4, loadbreak bushing adapters 61 and 62 can be mounted on the poles 9 and 10, in place of the probes 28 and 28a, so that the device can be used on underground cables. For example, either the adapters which would fit all 15 and 25 kV bushings and Elastimold 35 kV bushings or the adapters which fit 35 kV RTE bushings could be used.

As also shown in FIG. 4, a D.C. hipot adapter 63 can be mounted between the pole 9 and the bushing adapter 61. The D.C. hipot adapter is an encapsulated high-voltage rectifier which can be used to test sections of underground cables to determine whether or not the insulation is still good and to determine if all grounds have been removed after completion of working on a de-energized underground system. The D.C. hipot adapter 63 rectifies the available system voltage and charges the cable to a D.C. voltage equal to the peak A.C. voltage supplied. While the D.C. voltage is high enough to test the cable, the current is limited by the meter circuitry so that in the event the cable is defective or grounds have been left on it, large fault currents will not result.

MODIFICATION

Figure 5:
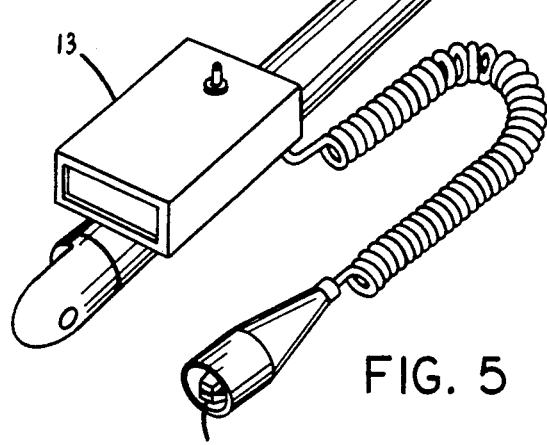
FIG. 5 is a schematic view of a digital, high-voltage meter device for underground circuit potential testing.

FIG. 5 illustrates a high voltage meter for underground potential testing. The second pole 10 is omitted. In its place, one end of the cable 14 is connected to a suitable connector, such as an alligator clip 66. The connector can be connected to the system ground. The appropriate loadbreak bushing adapter is connected to the pole 9 and is engagable with the appropriate wire or contact for measuring the underground potential. In this instance, in the electrical circuit illustrated in FIG. 3, the resistance value of the input resistor R1 will be one-half of the resistance value of the resistor R1 in the embodiment of FIGS. 1 through 4.

Although particular preferred embodiments of the invention have been described, the invention contemplates changes or modifications therein that lie within the scope of the appendant claims.

The embodiments of the invention in which an exclusive property or privilege is claimed are defined as follows:

1. A portable device, comprising:
means for identifying the phases and for determining the approximate line-to-line or line-to-ground voltage of overhead or underground electrical utility power supplies, including:
a pair of elongated, hollow poles made of electrical insulating material, each of said poles having a probe at one end thereof and containing high voltage resistor means connected to said probe and adapted to provide a low current output signal; a casing containing a circuit board providing a digital voltmeter and a battery for powering said voltmeter, said casing being mounted on one of said poles, said digital voltmeter having a pair of input terminals, one of said input terminals being connected to said resistor means in said one pole; a self-retracting, coiled, cable extending between said poles, said cable having a conductor, one end of which is connected to said resistor means in the other pole and the other end of which is connected to the other of said input terminals of said digital voltmeter whereby an A.C. signal is supplied to said digital voltmeter, said digital voltmeter comprising filter means for filtering out selected high frequency range and low frequency range of said signal, A.C. amplifier means for amplifying said signal, rectifier means for rectifying said signal, and a digital meter connected for receiving the rectified signal and providing a visible digital readout indicative of the voltage sensed by said probes.

2. A portable device as claimed in claim 1 wherein each of said poles is mounted on an elongated, electrically insulating hot stick.

3. A portable device as claimed in claim 1 in which said digital meter includes means for backlighting the digital readout and including a switch for selectively operating said backlighting means.

4. A portable device as claimed in claim 3 including voltage regulating means connected to said battery and adapted for supplying a reduced voltage for operating said backlighting means, said switch having a first operation position in which it supplies full battery voltage for providing the digital readout and does not supply said reduced voltage for operating said backlighting means and a second operating position in which it supplies full battery voltage for providing the digital readout and supplies said reduced voltage for operating said backlighting means.

5. A portable device as claimed in claim 1 in which said amplifier means and said rectifier means are separate stages of a monolithic, integrated circuit, operational amplifier chip.

6. A portable device as claimed in claim 1 in which said casing has an electrically conductive coating on its inner surface and said coating is electrically connected to said circuit board.

7. A portable device as claimed in claim 6, in which said electrically conductive coating is directly electrically connected to one of said input terminals.

8. A portable device, comprising:
means for determining the approximate line-to-ground voltage of underground electrical utility power supplies, including:
an elongated, hollow pole made of electrical insulating material, said pole having a probe at one end thereof and containing high voltage resistor means connected to said probe and adapted to provide a low current output signal; a casing containing a digital voltmeter and a battery for powering said voltmeter, said casing being mounted on said pole, said digital voltmeter having a pair of input terminals, one of said input terminals being connected to said resistor means in said pole; a self-retracting, coiled, cable extending from said pole, said cable having a connector at the free end thereof for removable connection to a ground terminal, said cable having a conductor one end of which is connected to said connector and the other end of which is connected to the other of said input terminals of said digital voltmeter whereby an A.C. signal is supplied to said digital voltmeter, said digital voltmeter comprising filter means for filtering out selected high frequency range and low frequency range of said signals, A.C. amplifier means for amplifying said signal, rectifier means for rectifying said signal, and a digital meter connected for receiving the rectified signal and providing a visible digital readout indicative of the voltage sensed by said probes.

9. A portable device for measuring a voltage difference between respective points on utility power lines, comprising: an elongate pole made of an insulating material, first and second probes each adapted for engagement with a utility power line, a digital voltmeter circuit having first and second input terminals and means electrically coupling each of said input terminals to a respective one of said probes, digital display means coupled to said voltmeter circuit for providing a visible digital display of a voltage difference between said probes, means defining an electrical shield disposed around said digital voltmeter circuit, said shield being electrically connected to one of said input terminals of said digital voltmeter circuit, and means supporting on said pole said digital voltmeter circuit, said digital display means and said means defining said shield.

10. A portable device of claim 9, including a non-conductive casing, said means defining said electrical shield including an electrically conductive coating provided on an inner surface of said casing.

11. A portable device of claim 10, wherein said means electrically coupling each said input terminal to a respective probe includes first and second resistors which are each disposed outside of said casing and which each have a first end electrically connected to a respective said input terminal and a second end connected to a respective said probe.

12. A device of claim 9, including a source of power having a battery and a manually actuable first switch connected in series with each other between power and ground lines of said voltmeter circuit.

13. A device of claim 12, wherein said digital display means includes a backlight for illuminating said visible digital display, and backlight control means coupling an end of said battery remote from said circuit ground to said backlight, said backlight control means including a second switch which is mechanically coupled to said first switch for synchronous operation therewith so that said second switch is in first and second positions when said first switch is respectively in first and second positions, said second switch respectively conducting and interrupting power to said backlight in said first and second positions thereof and said backlight in said first and second positions thereof and said first switch conducting power to said voltmeter circuit in each of said first and second positions thereof.

14. A device of claim 13, wherein said backlight control means includes a voltage regulator connected in series with said second switch between said battery and said backlight.

15. A device of claim 9, wherein said digital voltmeter circuit includes a circuit ground, and wherein said input terminal to which said shield is connected is free of direct electrical connection to said circuit ground.

16. A device of claim 9, wherein said voltmeter circuit includes a first resistor having first and second ends respectively connected to said first and second input terminals, a first capacitor having first and second ends respectively connected to said first and second ends of said first resistor, a spike suppressor element having first and second ends respectively connected to said first and second ends of said first resistor, a second resistor having a first end connected to said first end of said first resistor and having a second end, a second capacitor having a first end connected to said second end of said second resistor and having a second end, a third capacitor having a first end connected to said second end of said second capacitor and having a second end connected to said second end of said first resistor, a first diode having an anode connected to said second end of said second capacitor and having a cathode connected to a source of power, a second diode having a cathode connected to said second end of said second capacitor and having an anode connected to a circuit ground, a fourth capacitor having a first end connected to said cathode of said first diode and a second end connected to said anode of said second diode, a third resistor having a first end connected to said second end of said second capacitor and having a second end, a first operational amplifier having a first input coupled to said second end of said third resistor, having a second input and having an output, a fifth capacitor having a first end connected to said first input of said first operational amplifier and having a second end connected to said output of said first operational amplifier, a fourth resistor connected in parallel with said fifth capacitor, a fifth resistor having a first end connected to said second input of said first operational amplifier and having a second end connected to said second end of said first resistor, a sixth resistor having a first end connected to said output of said first operational amplifier and having a second end connected to said second end of said first resistor, a seventh resistor having a first end connected to said cathode of said first diode and a second end connected to said second end of said first resistor, an eighth resistor having a first end connected to said output of said first operational amplifier and having a second end, a second operational amplifier having a first input, having a second input connected to said output of said first operational amplifier, and having an output, a third diode having an anode connected to said first input of said second operational amplifier and having a cathode connected to said output of said second operational amplifier, a ninth resistor having a first end connected to said anode of said third diode and having a second end, a fourth diode having an anode connected to said output of said second operational amplifier and having a cathode connected to said second end of said ninth resistor, a third operational amplifier having a first input connected to said second end of said eighth resistor, having a second input and having an output, a tenth resistor having a first end connected to said second input of said third operational amplifier and having a second end connected to said second end of said first resistor, and eleventh resistor having a first end connected to said second end of said eighth resistor and having a second end connected to said cathode of said fourth diode, a fifth diode having an anode connected to said second end of said eighth resistor and having a cathode connected to said output of said third operational amplifier, a sixth diode having an anode connected to said output of said third operational amplifier and having a cathode connected to said cathode of said fourth diode, a sixth capacitor having a first end connected to said second end of said first resistor and a second end connected to said circuit ground, a twelfth resistor connected in parallel with said sixth capacitor, a seventh capacitor having a first end connected to said cathode of said sixth diode and having a second end connected to said second end of said first resistor, a thirteenth resistor having a first end connected to said cathode of said sixth diode and having a second end connected to a first input of said digital display means, and a fourteenth resistor having a first end connected to said first input of said digital display means and having a second end connected to a second input of said digital display means and to said second end of first resistor.

17. A portable device of claim 9, including a second elongate pole made of an insulating material, said first and second probes each being supported on a respective one of said poles; including a non-conductive casing, said means defining said electrical shield including an electrically conductive coating provided on an inner surface of said casing; and wherein said means electrically coupling each said input terminal to a respective one of said probes includes first and second resistors which are each disposed outside of said casing, which are each supported on a respective one of said poles, and which each have a first end electrically connected to a respective said input terminal and a second end connected to a respective said probe.

* * * * *

UNITED STATES PATENT AND TRADEMARK OFFICE
CERTIFICATE OF CORRECTION

PATENT NO. : 5 136 234

DATED : August 4, 1992

INVENTOR(S) : Lewis A. SHAW

It is certified that error appears in the above-identified patent and that said Letters Patent is hereby corrected as shown below:

Column 9, line 31, change "and eleventh" to --an eleventh--.

Signed and Sealed this

Sixteenth Day of November, 1993

Attest:

BRUCE LEHMAN

Attesting Officer

Commissioner of Patents and Trademarks